United States Patent [19]

Kameyama et al.

[11] Patent Number: 5,270,227
[45] Date of Patent: Dec. 14, 1993

[54] METHOD FOR FABRICATION OF SEMICONDUCTOR DEVICE UTILIZING ION IMPLANTATION TO ELIMINATE DEFECTS

[75] Inventors: Shuichi Kameyama, Itami; Genshu Fuse, Toyonaka, both of Japan

[73] Assignee: Matsushita Electric Industrial Co., Ltd., Osaka, Japan

[21] Appl. No.: 858,107

[22] Filed: Mar. 26, 1992

[30] Foreign Application Priority Data

Mar. 27, 1991 [JP] Japan .................... 3-062805

[51] Int. Cl.$^5$ .......................... H01L 21/266
[52] U.S. Cl. .................. 437/35; 148/DIG. 1; 148/DIG. 10
[58] Field of Search ............ 437/31, 32, 35, 59, 437/973; 148/DIG. 1, DIG. 9, DIG. 10, DIG. 154

[56] References Cited

U.S. PATENT DOCUMENTS

| | | | |
|---|---|---|---|
| 3,615,875 | 10/1971 | Morita et al. | 437/35 |
| 4,663,191 | 5/1987 | Choi et al. | 437/200 |
| 4,698,899 | 10/1987 | Kakihana | 437/44 |
| 5,034,791 | 7/1991 | Kameyama et al. | 437/29 |
| 5,073,514 | 12/1991 | Ito et al. | 437/35 |

FOREIGN PATENT DOCUMENTS

| | | |
|---|---|---|
| 0409561 | 7/1990 | European Pat. Off. . |
| 105209.8 | 8/1992 | European Pat. Off. . |
| 2204446 | 11/1988 | United Kingdom . |

OTHER PUBLICATIONS

Wolf, et al., "Silicon Processing for the VLSI Era", pp. 384–388, 1986.
"Crystalline Disorder Reductions Defect-Type Change in Silicon on Sapphire Films by Silicon Implantation and . . . Annealing" by T. Inoue et al., 320, Applied Phys. Letter, vol. 36, (1980) Jan., No. 1, New York, pp. 64–66.
"Crystalline Quality . . . Annealing" by T. Inoue et al., 2107, Nuclear Inst.-Methods, vol. 182/183 (1981) Apr.-/May, part 2, pp. 683–690.

Primary Examiner—Brian E. Hearn
Assistant Examiner—C. Chaudhari
Attorney, Agent, or Firm—Ratner & Prestia

[57] ABSTRACT

An improved method for fabrication of a super-high density semiconductor device wherein ion implantation is used to eliminate defects or inhibit the occurrence of growth of defects in the semiconductor device. Ions of high concentration are implanted into a monocrystal semiconductor region in which principal elements such as bipolar element and MOS element are formed, by using a mask pattern covering the semiconductor region and at a largely inclined implantation angle equal to or of more than 20 degrees. This provides for formation of amorphous regions 170A, 170B extending sufficiently into areas beneath the ends of the mask. The amorphous regions are recrystallized by heat treatment, thereby inhibiting the growth of a corner defect known as "voids 21" which has often occurred at edges of amorphous regions 170A, 170B in the conventional method. Thus, a device which is less liable to electrical leaks is provided.

7 Claims, 9 Drawing Sheets

METHOD FOR FABRICATION OF SEMICONDUCTOR DEVICE UTILIZING ION IMPLANTATION TO ELIMINATE DEFECTS

BACKGROUND OF THE INVENTION

1. Field of the Invention

The present invention relates to a method for fabrication of a semiconductor device having elements arranged with super-high density employing ion implantation for eliminating possible defects in the semiconductor device or inhibiting the occurrence or growth of such defects.

2. Description of the Prior Art

Recently, in the fabrication of semiconductor devices, it becomes common that elements are very densely arranged in a limited space so that the stress thereof is increased, which easily leads to growth of defects generated in the device. Such defects often generated in the conventional semiconductor devices are explained with reference to a metal-oxide-semiconductor (MOS) field effect transistor by way of example as shown in FIGS. 19(a) and 19(b).

In FIG. 19(a), a polysilicon film 130 to serve as a gate electrode and a side wall oxide film 142 for forming an LDD (lightly doped drain) structure are formed on a p-type monocrystal semiconductor substrate 105 via a silicon oxide layer 112 for the gate dielectric film. In the p-type monocrystal semiconductor substrate 105, there are formed semiconductor regions 161 which are to serve respectively as a source and a drain, by vertical ion implantation, specifically by vertically applying arsenic ion beams 300. At the same time, an amorphous region 171 involving some minute defects is formed on the semiconductor region 161 in the silicon substrate 105 to serve as an external base region due to some ion implantation damage. As shown in FIGS. 19(a) and 19(b), one particularly noticeable aspect of the conventional semiconductor device is that the amorphous region 171 formed by such generally vertical ion implantation has a configuration of its source/drain edge portion reversely tapered (acute-angled).

When the amorphous region 171 is subjected to heat treatment for recrystallization growth, as shown in FIG. 19(b), the crystallization growth is induced in the amorphous region 171 within the semiconductor substrate 105 in two directions nearly orthogonal to each other, one is perpendicular to the horizontal bottom boundary surface and the other is perpendicular to the vertical side boundary surface thereof, i.e., upward oriented direction 204 and sideways oriented direction 202. These two oriented crystallization growths finally collide with each other, resulting in that there occurs some local crystal discontinuity which causes a defect known as "void" 210 (a corner defect). When any stress is applied to this local defect, the void 210 leads to further growth of the defect. The occurrence of such local defect growth is reported by Tamura et al in "Nuclear Instruments and Methods", B37/38 (1989), p. 329.

In the conventional method of ion implantation as described above, the formation of such a void 210 naturally leads to frequent crystal defect occurrence in the corner, so that the crystal defect in the corner may extend to a PN junction of elements having high precision and further extend across the PN junction which is very sensitive to such a crystal defect. As a consequence, there occurs a trouble that various abnormal current (such as reverse leakage current and forward recombination current) flows through the defect. When there exists a defect at the PN junction or in the vicinity thereof, a forward or reverse abnormal current flows according to the polarity of the voltage applied to the PN junction. In such a case, no good performance characteristics can be expected with respect to the element. This adversely affects the yield of non-defective elements.

The existence of such defect poses a serious problem not only with respect to the source-to-drain junction in MOS, but also in the case of bipolar elements or the like, when an implantation of ions of high concentration is carried out using a mask to form an amorphous region. For example, when an amorphous region which has been formed by ion implantation having a high concentration of ions for forming an external base region of a vertical bipolar NPN transistor is recrystallized by heat treatment, some stressed defect is likely to occur in the external base region. The existence of such defect induces abnormal diffusion of an emitter-base junction formed in the vicinity of the defect. In order to avoid such an abnormal diffusion, it is desirable that the amorphous semiconductor region for the external base is to be converted into a normal monocrystal semiconductor region free from such a crystal defect to thereby inhibit such abnormal diffusion of the emitter.

Further, when such a crystal defect is formed, it is likely to cause a secondary deterioration to the crystalline structure of a junction. A variety of electrode wiring techniques have been developed such that after an external base or a source-drain region is formed, an opening for the base electrode or source/drain electrode is formed and then the semiconductor surface of the opening is silicidized (which is generally known as alloying of metal and semiconductor). In such technique, however, even though there may be not generated an electric leakage directly caused by a defective area involving a crystal defect, a nucleus of such defect, or the like which has been created in the external base or source-drain region as a result of recrystallization by a method of solid-phase epitaxial growth in the heat treatment, metal atoms of the silicide will cause abnormal diffusion of the defective area under the stress of silicidization, and this may easily result in destruction or deterioration (i.e., occurrence of electric leakage) of a base-emitter junction and/or source-drain junction adjacent to the defective area.

In view of the growing trend of super-high densification in the fabrication of semiconductor devices, therefore, the problem of mechanical stress due to heat treatment and otherwise will hereafter become more and more serious because increased mechanical stress causes a greater flow of leakage current, it being thus more and more difficult to fabricate non-defective semiconductor devices.

SUMMARY OF THE INVENTION

The present invention incorporates by reference the teaching of the U.S. patent application Ser. No. 707,801 (filing date of May 30, 1991) by the present applicant and is directed to overcoming the foregoing problems. Accordingly, it is a primary object of the invention to provide a novel method for fabrication of a superhigh-density semiconductor device using ion implantation which can eliminate possible defects and/or inhibit occurrence or growth of defects.

In order to accomplish the above object, according to one aspect of the invention, there is provided a method for fabrication of a semiconductor device utilizing ion implantation, which comprises the steps of: forming a mask pattern covering a monocrystal semiconductor region in which an emitter of a vertical bipolar element is formed; implanting ions into the semiconductor region in which an external base is formed with high concentration of ions using the mask pattern as a mask, wherein the ion implantation is performed at a considerably inclined implantation angle of more than 20 degrees with respect to the perpendicular direction relative to the surface of a wafer, thereby to form an amorphous region extending sufficiently into an area beneath the mask; and recrystallizing the amorphous region by heat treatment.

According to another aspect of the invention there is provided a method for fabrication of a semiconductor device utilizing ion implantation, which comprises the steps of: forming a mask pattern on a monocrystal semiconductor region; implanting ions into the semiconductor region in which an external base is formed with high concentration of ions using the mask pattern as a mask, wherein the ion implantation is performed at a considerably inclined implantation angle of more than 20 degrees with respect to the perpendicular direction relative to the surface of the wafer, thereby to form an amorphous region extending sufficiently into an area beneath the mask; forming an alloy of metal and semiconductor on the exposed surface of the opening of the semiconductor region which is not covered with the mask pattern; and recrystallizing the amorphous region by heat treatment, whereby the metal atoms for composing the alloy are inhibited from being anomalously diffused within the semiconductor region which contains the impurity of high concentration.

According to the above described method of the present invention, in order to form a semiconductor region for serving as an external base or the like of a vertical bipolar NPN transistor, impurity atoms of high concentration of ions are implanted into the masked substrate (semiconductor region) at a considerably inclined implantation angle (which angle may be more than 20 degrees as stated in the U.S. patent application Ser. No. 707,801 filed on May 30, 1991 by the present applicant), which can be readily seen from FIG. 18. The effect of this inclined ion implantation is such that, as shown in FIG. 17(b), the amorphous region formed for the external base has a gently sloping (or obtuse angled) configuration immediately beneath the mask edge, which stands in striking contrast with the reverse tapered (sharp or acute angled) configuration when the conventional way of implantation is performed by implanting ions at substantially vertical direction with respect to the surface of the wafer. Therefore, the problem with in the conventional method that recrystallization during heat treatment takes place in a way that crystal growth occurs in two directions at an angle of nearly 90 degrees (i.e., sharp-angle growth pattern) can be successfully solved. By virtue of the obtuse-angled configuration at the corner of the amorphous region, it is effectively suppressed to generate a nucleus about which a defect called "void" (corner defect) may occur. Therefore, defective generation due to the growth of defects can be suppressed even under a comparatively large stress encountered in any subsequent stage such as heat treatment, thereby enabling to provide a satisfactory LSI (large-scale integration).

The present invention has another advantage as explained below relative to a conventional ion implantation technique in which impurity atoms of high concentration are implanted into a masked substrate (or monocrystal semiconductor region) in order to form a semiconductor region such as external base or source/drain of a vertical bipolar NPN transistor. In this conventional technique, even though the crystal defect caused by the heat treatment may not directly cause such electric leakage, metal atoms of the silicide will become abnormally diffused along any crystal defect (void) created by heat treatment in the process of electrode wiring for forming an opening for the electrode of the base or source-drain region and in the process for silicidizing the exposed surface of the semiconductor, and therefore the base-emitter junction or source-drain junction located adjacent the defective region is easily deteriorated (i.e., there occurs an electric leakage). According to the method of the invention, even in the case where crystal defects, though they are present locally, have not caused development of a primary leakage current, but where a secondary crystal deterioration is likely to occur in a junction created by silicidization, such deterioration of the junction can be avoided; and therefore, any possible decrement in yield that is attributable to the silicidization for reduction of resistance can be effectively avoided.

BRIEF DESCRIPTION OF THE DRAWINGS

These and other objects and features of the present invention will become apparent from the following description taken in conjunction with the preferred embodiment thereof with reference to the accompanying drawings, in which.

DETAILED DESCRIPTION OF THE PREFERRED EMBODIMENT

In the preferred embodiment, it is to be noted that as an ion implantation method there may be employed two methods: one is a rotating implantation method in which the ion implantation direction is continuously varied by rotation; and the other is a step-by-step rotating implantation method in which the ion implantation is carried out in a manner of step-by-step rotation (i.e., repetition of ... rotation/stop/rotation ...).

A first example of the method of fabricating a semiconductor device utilizing ion implantation in accordance with the invention will now be described with reference to the drawings (FIGS. 1 to 4 in particular).

Figure 1:
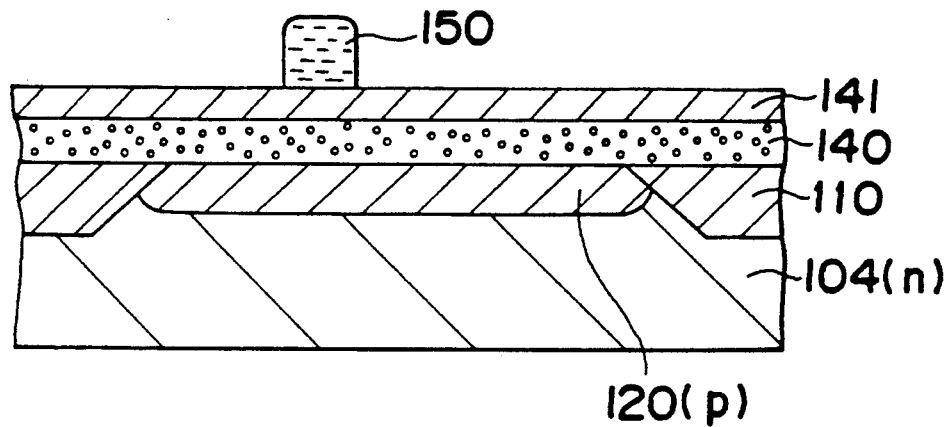
FIG. 1 is a sectional view depicting a first step of fabrication in a first example of the invention.

Referring to FIG. 1, a thick silicon oxide film layer 110 of about 400 nanometers in thickness which is to serve as an isolation film for isolating elements is formed on an N-type monocrystal silicon semiconductor layer 104. A low-energy ion implantation into the semiconductor layer 104 was performed using boron ions in a dose amount of $1 \times 10^{13}$ cm$^{-2}$ to $3 \times 10^{13}$ cm$^{-2}$ and heat treatment was effected at approximately 900° C. to form a P-type semiconductor region 120. Then, polycrystal silicon semiconductor film 140 of about 200 nanometers in thickness containing arsenic (As) impurity, and silicon oxide film 141 were deposited sequentially on main surface of the semiconductor structure, and thereafter, according to the conventional photomask technique, a resist pattern 150 having a width of about 500 nanometers was formed on a specified portion of the semiconductor structure in which an emitter of an NPN transistor is formed.

Figure 2:
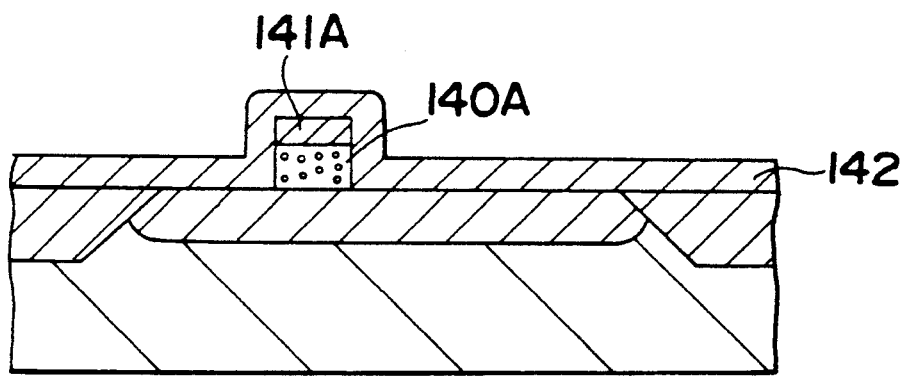
FIG. 2 is a sectional view depicting a second step of fabrication in the first example of the invention.

Referring to FIG. 2, the main surface of the semiconductor structure was subjected to an etching process using the resist pattern 150 as a mask thereby to form a patterned silicon oxide film 141A and polysilicon semiconductor film 140A, and then silicon oxide film 142 of about 300 nanometers in thickness was deposited over the main surface of the semiconductor structure.

Figure 3:
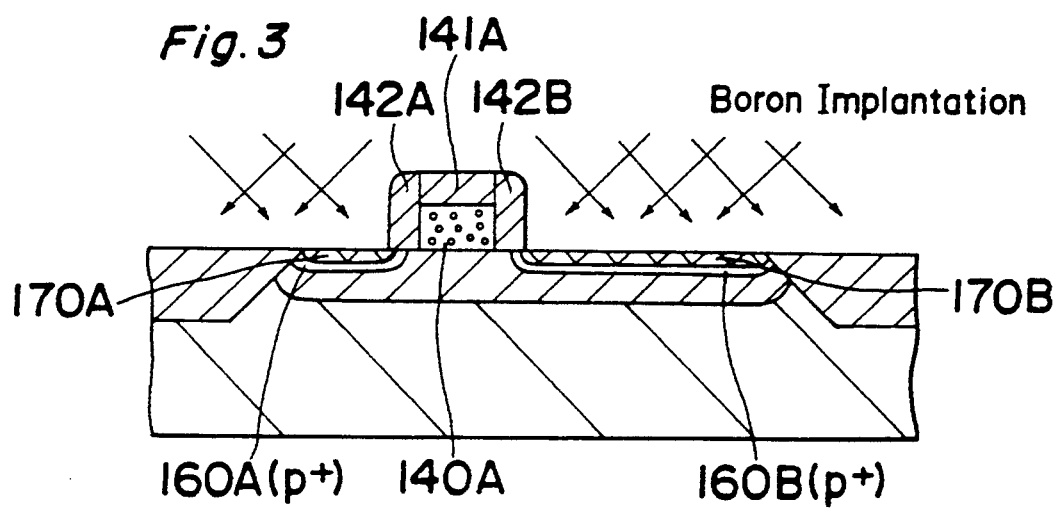
FIG. 3 is a sectional view depicting a third step of fabrication in the first example of the invention.

Referring to FIG. 3, silicon oxide film 142 was removed by anisotropic dry etching to leave silicon oxide films 142A and 142B on both sides of the polysilicon film 140A. Thereafter, implantation processes using boron ions (in each dose amount of $1 \times 10^{15}$ to $1 \times 10^{16}$ cm$^{-2}$) were carried out two times (or a number of times, if necessary) from different directions as shown and at an oblique implantation angle of about 45 degrees relative to the normal perpendicular to the main surface of the semiconductor structure, to thereby form P-type semiconductor regions 160A, 160B and silicon amorphous regions 170A, 170B with their edge portions extended into areas right under the silicon oxide films 142A, 142B which would serve as masks.

Figure 4:
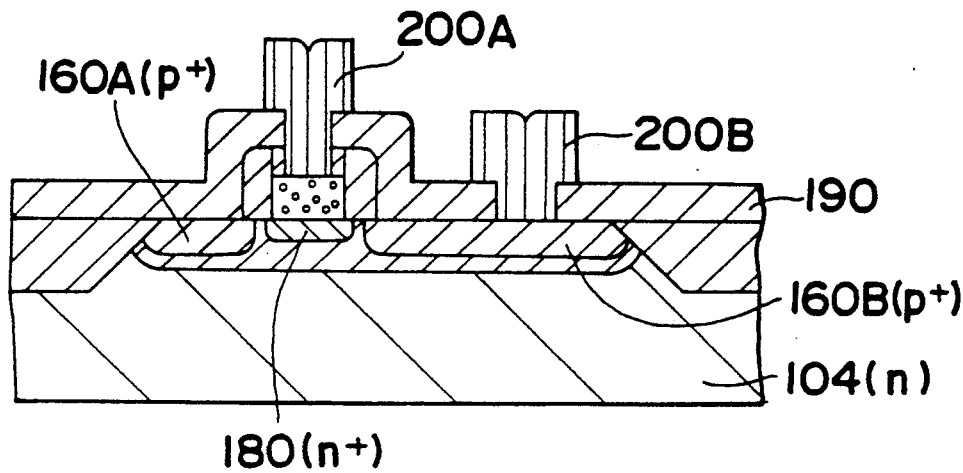
FIG. 4 is a sectional view depicting a fourth step of fabrication in the first example of the invention.

Referring to FIG. 4, a silicon oxide layer 190 of about 300 nanometers in thickness was deposited over the semiconductor structure, and then heat treatment was carried out at 900° to 950° C. for 30 minutes to form an N-type semiconductor region 180 of 50 to 100 nanometers in depth which would serve as an emitter. In this process, the amorphous semiconductor regions 170A and 170B were transformed due to solid-phase epitaxial growth to become P-type monocrystal semiconductor regions, which the transformed regions were integrally combined with the P-type monocrystal semiconductor regions 160A, 160B which will serve as external bases. Further, aluminum electrodes 200A, 200B, and the like were formed according to the conventional fabrication method.

Figure 5:
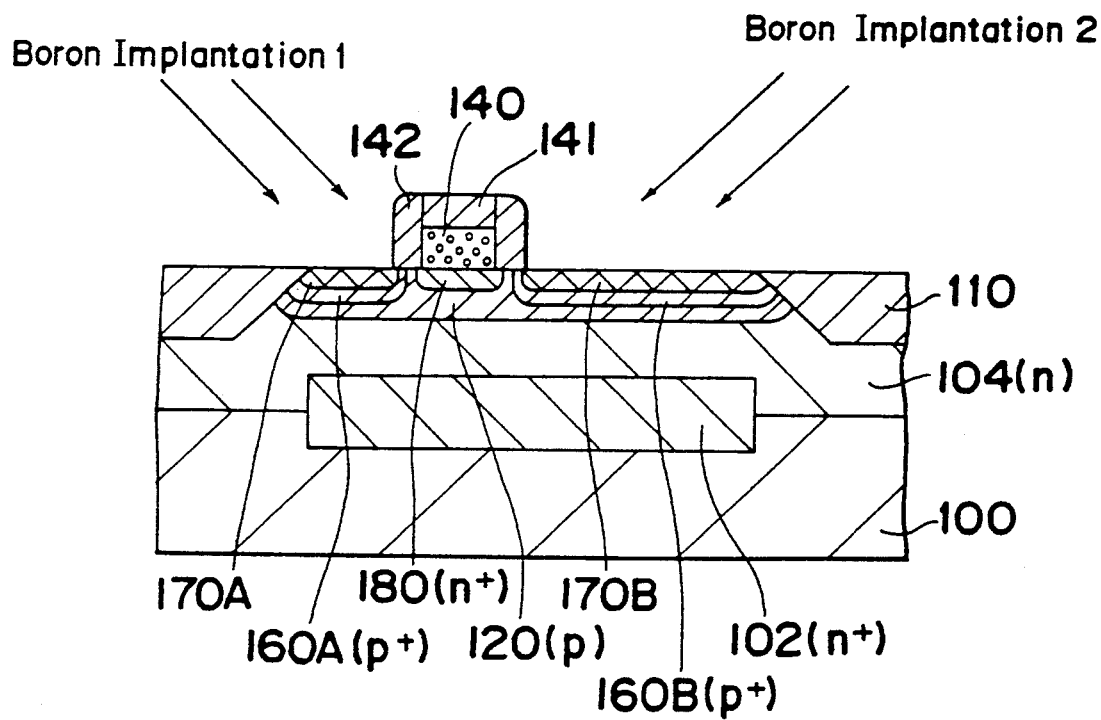
FIG. 5 is a sectional view explaining the features of the fabrication steps in the first example of the invention.
Figures 17A, 17B:
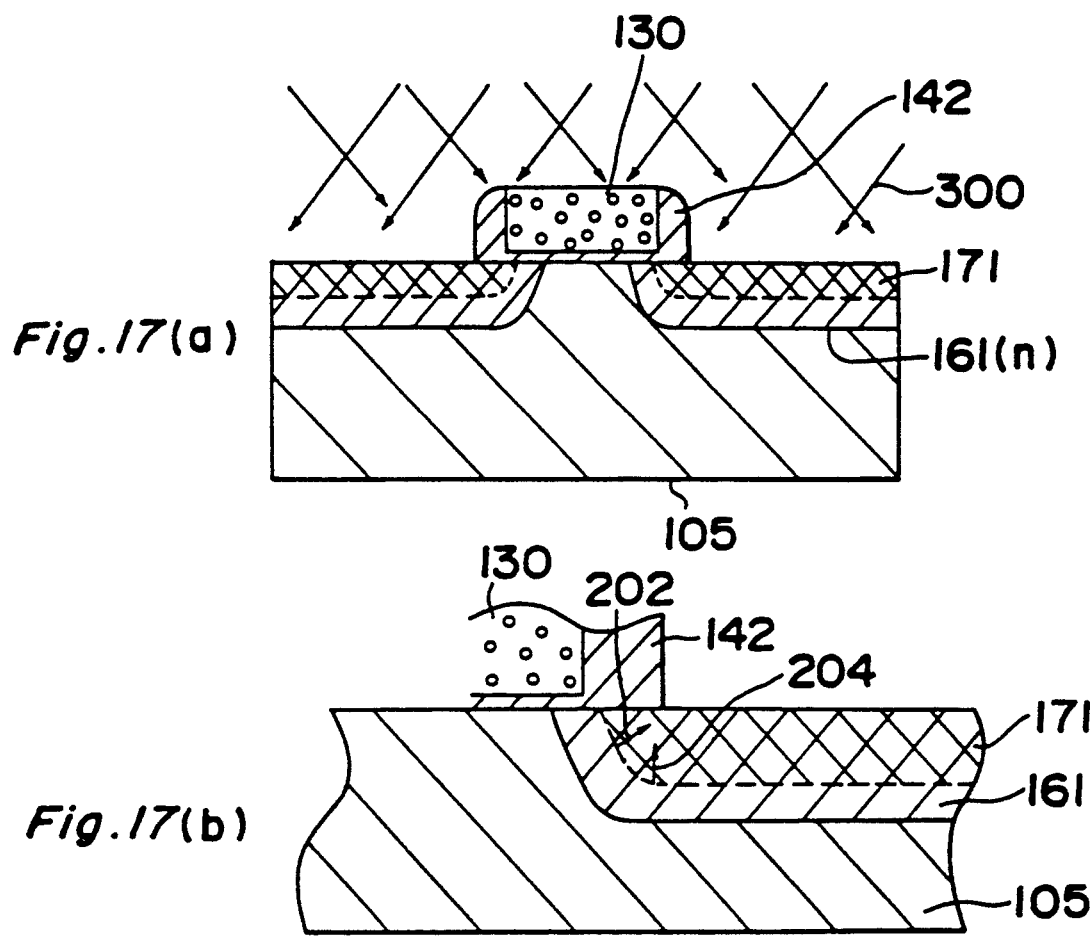
FIGS. 17(a) and 17(b) are sectional views explaining the features of the fabrication steps in the first example of the invention.
Figure 18:
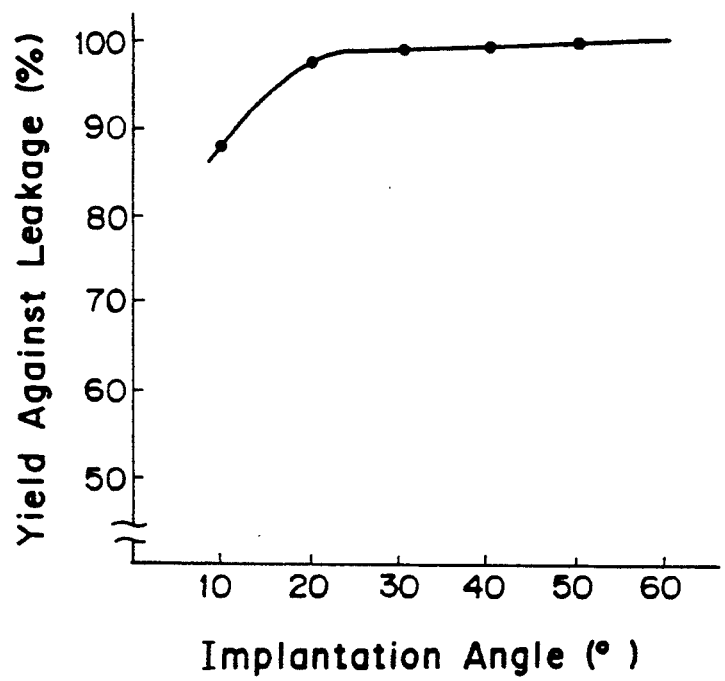
FIG. 18 is a characteristic diagram showing yield against possible leakage relative to implantation angle in the method of the invention.
Figures 19A, 19B:
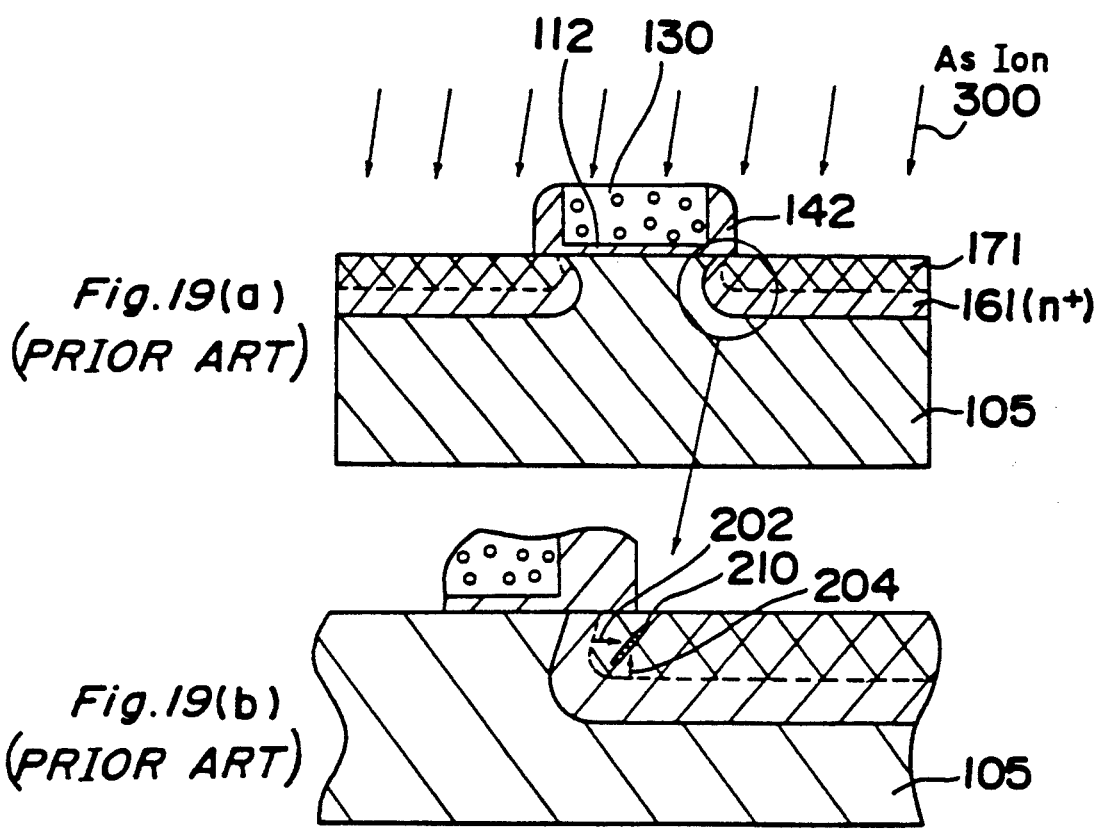
FIGS. 19(a) and 19(b) are sectional views explaining technical problems with the conventional method.

Referring to FIG. 5, according to the fabrication method of the present example, in order to form a semiconductor region for external base, and the like of a vertical bipolar NPN transistor having a P-type semiconductor substrate 100 and an N-type buried semiconductor region, ion implantation having a high-concentration of impurity atoms such as boron is carried out from two directions (shown as boron implantation directions 1, 2 in FIG. 5) and at a comparatively large oblique implantation angle (of more than about 20 degrees), into a semiconductor substrate (N-type epitaxial semiconductor region 104) covered with mask patterns of silicon oxide films 142A and 142B. As a consequence, the amorphous regions 170A and 170B formed in the external base by some damage due to the ion implantation have a gently sloping (or obtuse angled) configuration at their edge portions. That is, as shown in FIGS. 17(a) and 17(b), as the result of the ion implantation step at a large implantation angle, each of the amorphous regions is so formed as to have a substantially inverse trapezoidal vertical cross section each end of which is located beneath an edge of the mask member, which stands in striking contrast with the reverse tapered (sharp-angled) configuration in the case where the conventional way of implantation is employed, in which the direction of implantation is substantially vertical relative to the main surface of the semiconductor structure. Thus, the trouble with the conventional method of fabricating a semiconductor device could be avoided. By virtue of the obtuse-angled configuration of the amorphous region, there was not created any nucleus about which a defect called "void" (corner defect) would otherwise have occurred. Therefore, defective output due to the growth of defects could be minimized even under a comparatively large stress encountered in the subsequent stage of heat treatment. Thus, fabrication of a satisfactory LSI was achieved. It is noted that the temperature of heat treatment for recrystallization of the amorphous semiconductor region by solid-phase epitaxial growth depends upon the type of impurity atoms and concentration thereof. In the case of silicon semiconductor, monocrystallization can be initiated at a relatively low temperature of about 500° C.

In this way, according to the method of the invention, there can be provided a vertical NPN bipolar transistor having a microfine emitter of about 500 nanometers in width having characteristics favorable with less possible electric leakage.

A second example of the method of a main portion of an N-channel MOS (NMOS) transistor of the invention will be described with reference to FIGS. 6 to 10.

Figure 6:
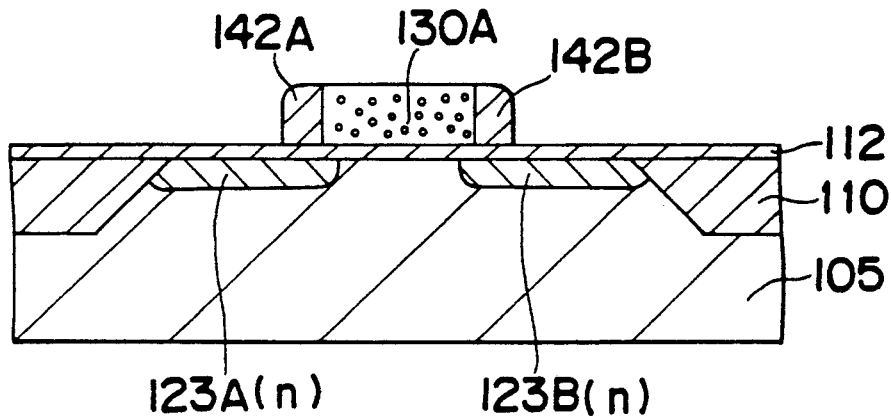
FIG. 6 is a sectional view depicting a first step of fabrication in a second example of the invention.

Referring to FIG. 6, a silicon oxide film 110 of about 400 nanometers in thickness for element isolation, a gate oxide film 112 of about 10 to 30 nanometers in thickness, and a polysilicon film pattern 130A of 50 to 150 nanometers in thickness which was to serve as a wiring-configured gate electrode of 0.3 to 0.8 microns were formed on a P-type monocrystal silicon semiconductor layer or substrate 105. An ion implantation was carried out using the polysilicon film pattern 130A as a mask thereby to form N-type semiconductor regions 123A and 123B. Thereafter, CVD silicon oxides 142A and 142B of 200 to 300 nanometers which would serve as side wall films were left as side walls located on both sides of the polysilicon film 130A.

Figure 7:
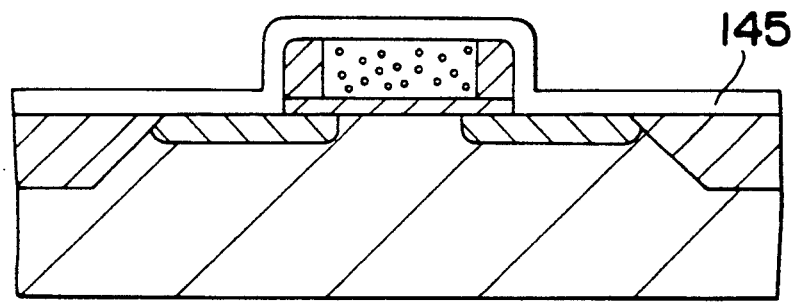
FIG. 7 is a sectional view depicting a second step of fabrication in the second example of the invention.

Referring to FIG. 7, the gate oxide film 112 was partially removed self-alignedly by etching, and then a metallic (titanium) layer 145 of about 30 nanometers in thickness was deposited over the main surface of the semiconductor structure.

Figure 8:
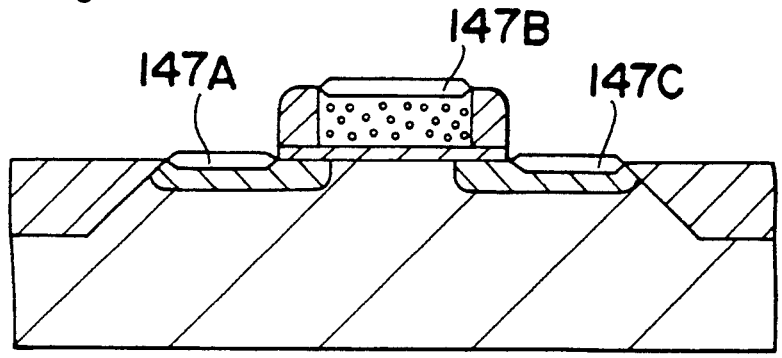
FIG. 8 is a sectional view depicting a third step of fabrication in the second example of the invention.

As shown in FIG. 8, a rapid thermal annealing (RTA) was carried out at 600° C. to 800° C. for about one minute thereby to cause the titanium layer 145 to react with the polysilicon film 130A and N-type semiconductor regions 123A and 123B, thereby leaving titanium silicide layers 147A, 147B and 147C on the surfaces of the respective silicon films 123A, 123B and 130A. As a result of this treatment, the surface resistances of the silicidized silicon regions were reduced.

Figure 9:
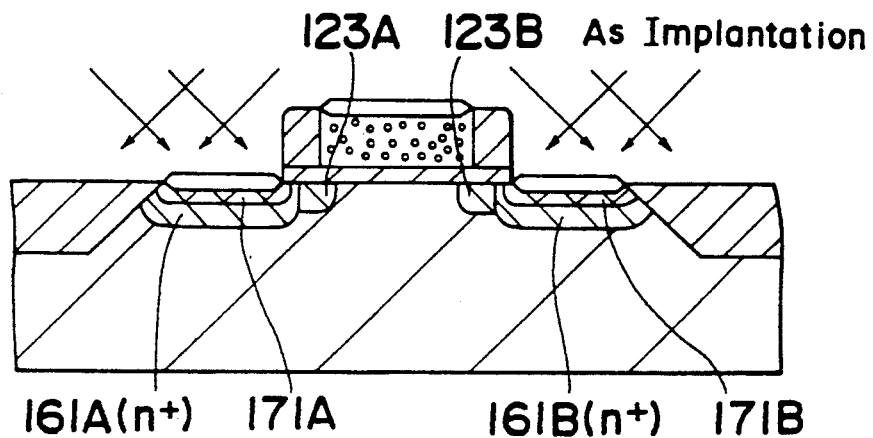
FIG. 9 is a sectional view depicting a fourth step of fabrication in the second example of the invention.

As shown in FIG. 9, implantation of arsenic ions (in each dose amount of $1 \times 10^{15}$ to $1 \times 10^{16}$ cm$^{-2}$) were carried out using silicon oxide films 142A and 142B as masks, two times from different directions at oblique implantation angles of about ±45 degrees relative to the normal perpendicular to the main surface of the semiconductor structure, to thereby form N-type semiconductor regions 161A, 161B and silicon amorphous regions 171A, 171B with their edge portions extended into areas right under the ends of the silicon oxide films 142A and 142B. In this case, at the end of the drain, the N-type semiconductor region 123B was left as a virtual drain or lightly doped drain (LDD). At the same time, the N-type semiconductor region 123A was left as a virtual source.

Figure 10:
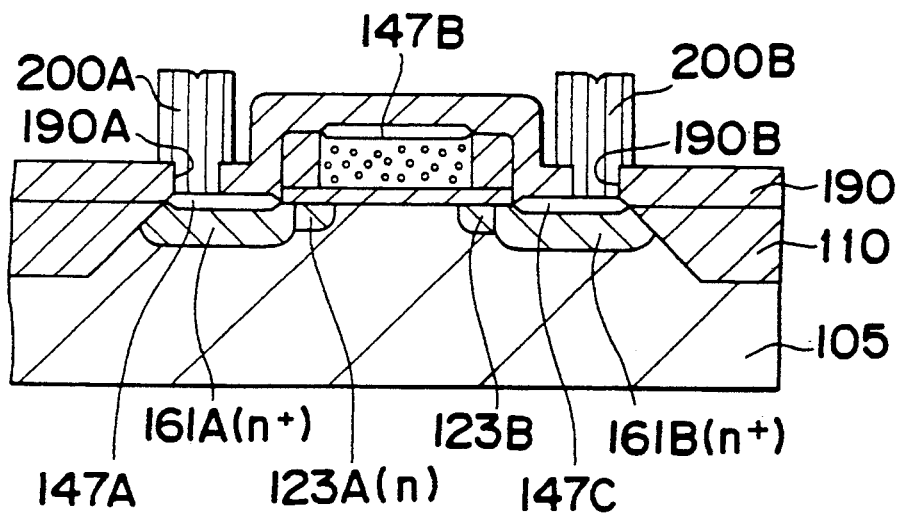
FIG. 10 is a sectional view depicting a fifth step of fabrication in the second example of the invention.

As shown in FIG. 10, an isolating silicon oxide film 190 was deposited over the semiconductor structure, and then amorphous semiconductor regions 171A, 171B were transformed into N-type monocrystal semiconductor regions through solid phase epitaxial growth by rapid heat treatment (RTA) at 600° to 800° C. These transformed regions 171A and 171B were integrally combined with the N-type monocrystal semiconductor regions 161A and 161B. Further, contacting openings 190A and 190B for contacting with exposed source, drain were formed according to the conventional method of fabrication, and then elements such as aluminum metal electrode 200A for the source and aluminum metal electrode 200B for the drain were disposed on the exposed openings 190A and 190B.

According to the fabrication method of the example 2 of the present invention, in order to form a semiconductor region containing impurities of high concentration which would be a portion of source and drain of an NMOS transistor, ion implantation having high-concentration of impurity atoms such as arsenic was carried out into a P-type semiconductor substrate covered with mask patterns of silicon oxide films 142A, 142B at a comparatively large oblique implantation angle (of more than about 20 degrees). As a consequence, the amorphous regions 171A, 171B, formed by some damage due to ion implantation have a gently sloping (or obtuse angled) configuration at their edge portions. That is, as shown in FIGS. 17(a) and 17(b), as the result of the ion implantation step at a large implantation angle, each of the amorphous regions is so formed as to have a substantially inverse trapezoidal vertical cross section each end of which is located beneath an edge of the mask member, which stands in striking contrast with the reverse tapered (sharp-angled) configuration in the case where the conventional way of implantation is employed, in which the direction of implantation is substantially vertical relative to the main surface of the semiconductor structure. Thus, the trouble with the conventional method that recrystallization by heat treatment takes place in a way that crystal growth occurs from two directions at an angle of nearly 90 degrees (due to the sharp-angled configuration) could be avoided. By virtue of the obtuse-angled configuration of the amorphous region, there was not created any nucleus for generating a defect called "void" (corner defect). Therefore, defective output due to the growth of defects could be minimized even under a comparatively large stress from the silicidized region as encountered during solid phase epitaxial growth or in another stage, such as heat treatment. Thus, fabrication of a satisfactory LSI was achieved. In this way, according to the method of the invention, there can be avoided a bad effect on the source-drain semiconductor region of the spike-shaped due to abnormal reaction or stress of silicidization during the stage of solid-phase epitaxial growth, silicidizing, or during the subsequent stage of heat treatment. In this example, although titanium silicide was used as metal silicide, other kinds of metal silicides, such as tungsten silicide and molybdenum silicide, may also be used.

Thus, according to the method of the invention, a microfine MOS transistor having a wiring-configured, low-resistance gate electrode of 0.3 to 0.8 microns in width could be fabricated with good electric characteristics.

A third example of the method of the invention, wherein a vertical bipolar NPN transistor and a P-channel MOS (PMOS) are incorporated together, will be explained with reference to FIGS. 11 to 13.

Figure 11:
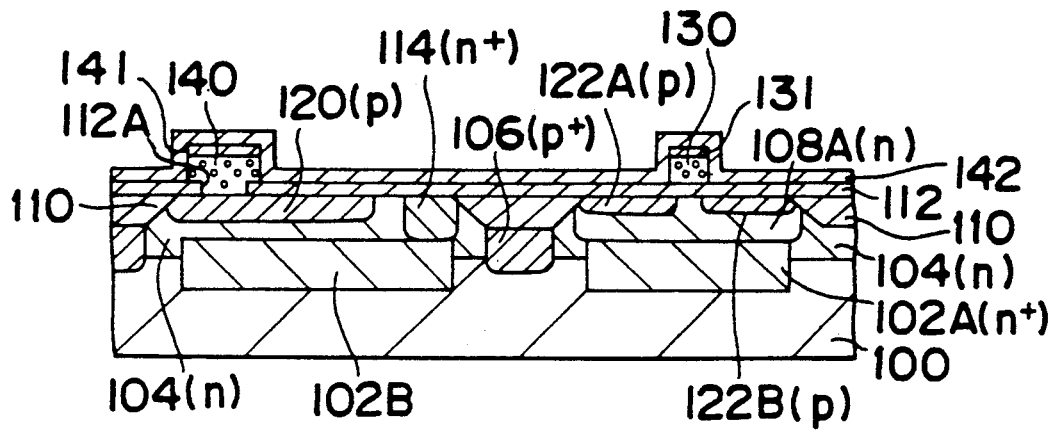
FIG. 11 is a sectional view depicting a first step of fabrication in a third example of the invention.

As shown in FIG. 11, N-type buried layers 102A and 102B were formed in a P-type monocrystal silicon semiconductor substrate 100, and then an N-type monocrystal silicon semiconductor layer 104 was formed by epitaxial growth. An N-type well region 108A was formed to a depth such that it reached the level of the buried region 102A, and thereafter a thick silicon oxide film 110 of about 300 nanometers in thickness which would serve as an insulating film for element isolation was formed on the silicon semiconductor layer 104. Then, there is formed in turn a silicon oxide film 112 of about 10 nanometers in thickness which would serve as a gate oxide film. A silicon oxide pattern 131 and a polysilicon oxide pattern 130 serving as a gate electrode with a silicon oxide pattern 131 formed thereon were in turn formed on the silicon oxide film 112. Otherwise, according to the conventional fabrication procedure, a P-type semiconductor region 106 for isolation of elements of bipolar NPN transistor, P-type semiconductor region 120 serving as an active base, N-type semiconductor region 114 for collector drawing, and P-type semiconductor regions 122A, 122B serving as source and drain of PMOS transistor were suitably formed by selecting ion implantation. Further, there is formed an opening 112A in a specified portion of the silicon oxide film 112 corresponding to the area for the emitter of an NPN transistor. Then, there is formed a polysilicon emitter electrode 140 containing impurities of As having a silicon oxide film 141 coated thereon covering over the predetermined area of the opening 112A for the emitter of NPN transistor. Thereafter, a silicon oxide film 142 of 100 to 200 nanometers in thickness was deposited all over the semiconductor structure.

Figure 12:
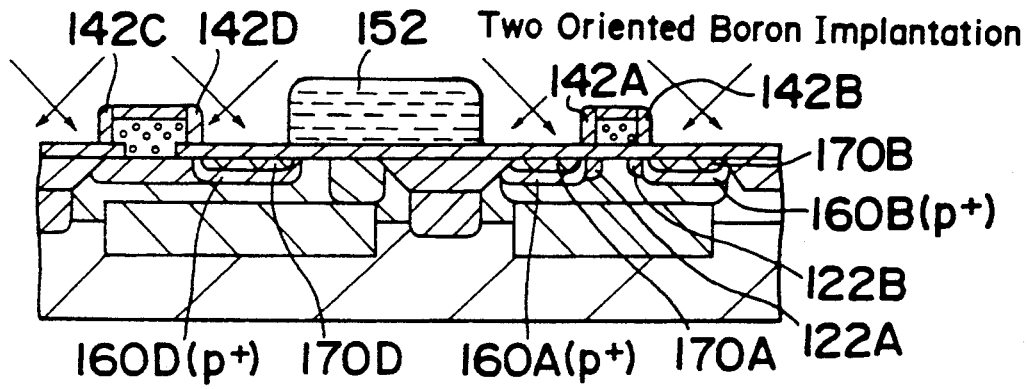
FIG. 12 is a sectional view depicting a second step of fabrication in the third example of the invention.

As shown in FIG. 12, the silicon oxide film 142 was removed by anisotropic etching as to leave silicon oxide films 142A, 142B serving as the first mask patterns on both sides of the polysilicon film 130 for gate and simultaneously to leave silicon oxide films 142C, 142D serving as the second mask patterns on both sides of the polysilicon film 140 for emitter. Subsequently, two times of implantation of boron ions (in each dose amount of $1 \times 10^{15}$ to $1 \times 10^{16}$ cm$^{-2}$ each) were carried out using a selectively formed photoresist layer 152 as a mask, from different directions at an oblique implantation angle of about 45 degrees relative to the normal perpendicular to the main surface of the semiconductor structure. Hereby P-type semiconductor regions 160A, 160B and silicon amorphous regions 170A, 170B with their edge portions extended into the areas right under the ends of the silicon oxide films 142A, 142B for PMOS, and simultaneously a P-type semiconductor region 160D and a silicon amorphous region 170D with their edge portions extended into the areas right under the end of the silicon oxide film 142D for NPN transistor. That is, as shown in FIGS. 17(a) and 17(b), as the result of the ion implantation step at a large implantation angle, each of the amorphous regions is so formed as to have a substantially inverse trapezoidal vertical cross section each end of which is located beneath an edge of the mask member, which stands in striking contrast with the reverse tapered (sharp-angled) configuration in the case where the conventional way of implantation is employed, in which the direction of implantation is substantially vertical relative to the main surface of the semiconductor structure.

Figure 13:
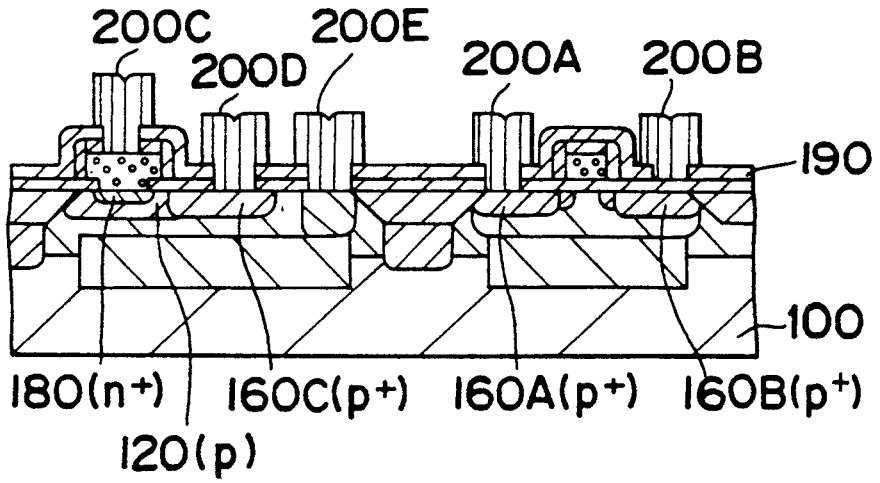
FIG. 13 is a sectional view depicting a third step of fabrication in the third example of the invention.

As shown in FIG. 13, a silicon oxide film 190 of about 300 nanometers in thickness was deposited all over the semiconductor structure, and then heat treatment was carried out at a temperature of 900° to 950° C. for 30 minutes thereby to form an N-type semiconductor region 180 of 50 to 100 nanometers in depth for serving as an emitter. In this process, the amorphous semiconductor regions 170A, 170B and 170D were transformed into P-type monocrystal semiconductor regions as a result of solid-phase epitaxial growth. The transformed semiconductor regions 170A and 170B were respectively integrally combined with the P-type monocrystal semiconductor regions 160A and 160B serving as source and drain, and simultaneously the other transformed semiconductor region 170D was integrally combined with the P-type monocrystal semiconductor region 160D serving as an extrinsic base. Further, aluminum electrodes 200A, 200B, 200C, 200D and 200E were formed according to the conventional method of fabrication.

In this way as described above, according to the method of the example 3, by recrystallizing under heat treatment of the amorphous region which was previously formed by carrying out oblique directed ion implantation, it becomes possible to inhibit the occurrence of defects known as "voids" (corner defects) which have been encountered in edge portions of the amorphous regions in the conventional method of semiconductor device. Thus, it is also possible to prevent the growth of any defect attributable to such comparatively large stress as is encountered in the stage of heat treatment. The method provides for fabrication in a good yield rate of a vertical type bipolar NPN transistor, less liable to electric leakage incorporated with a P-type channel MOS together and in a common process which involves a smaller number of stages.

A fourth example of the method of the invention, wherein a lateral-type bipolar PNP transistor and a P-channel MOS are incorporated together, will be explained with reference to FIGS. 14 to 16.

Figure 14:
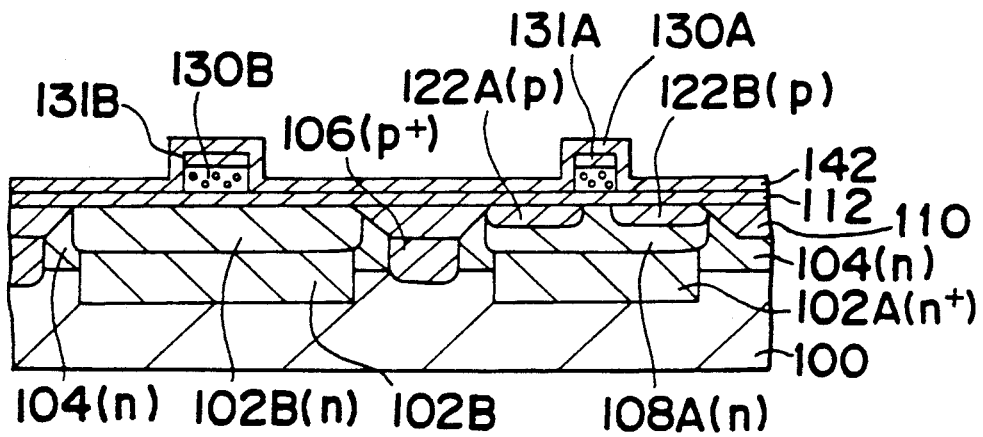
FIG. 14 is a sectional view depicting a first step of fabrication in a fourth example of the invention.

As shown in FIG. 14, N-type buried layers 102A and 102B were formed in a P-type monocrystal silicon semiconductor substrate 100, and then an N-type monocrystal silicon semiconductor layer 104 was formed by epitaxial growth. N-type well regions 108A and 108B were formed to a depth such that they reached the level of the buried regions 108A and 108B respectively. Then, a thick silicon oxide film 110 of about 300 nanometers in thickness which would serve as an insulating film for element isolation was formed on the silicon semiconductor layer 104, and thereafter a silicon oxide film 112 of about 10 nanometers in thickness which would serve as a gate oxide layer were formed on the silicon oxide film 112. Then, a polysilicon film pattern 130A which would serve as a gate electrode of PMOS having a silicon oxide film pattern 131A coated thereon were formed. Further, a polysilicon electrode 130B defining the base width of a PNP transistor having a silicon oxide film 131 coated thereon were formed, and thereafter a silicon oxide film 142 of 100 to 200 nanometers in thickness was deposited all over the semiconductor structure. Otherwise, according to the conventional procedure, a P-type semiconductor region 106 for isolation of bipolar PNP transistor, and P-type semiconductor regions 122A, 122B which would serve as source and drain of PMOS transistor respectively were suitably formed by selective ion implantation.

Figure 15:
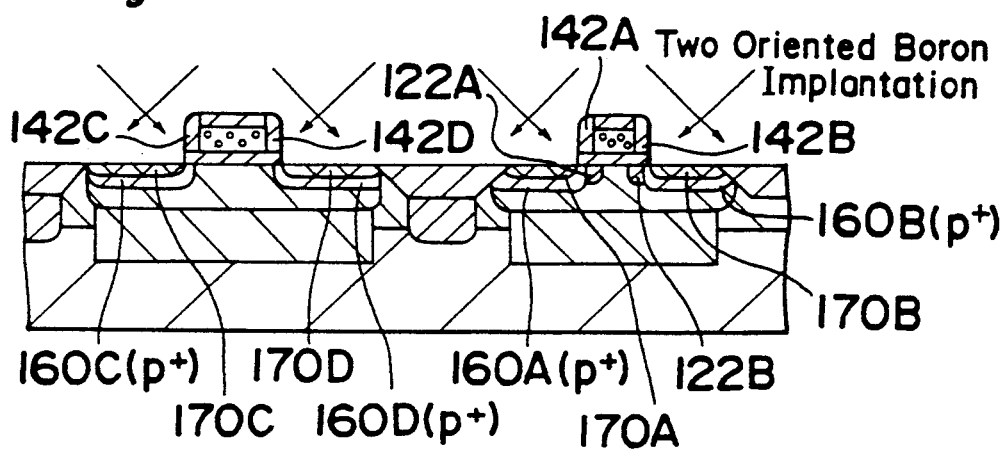
FIG. 15 is a sectional view depicting a second step of fabrication in the fourth example of the invention.

As shown in FIG. 15, the silicon oxide film 142 was removed by anisotropic etching to leave silicon oxide walls 142A, 142B serving as the first mask patterns on both sides of the polysilicon film 130A for gate and simultaneously to leave silicon oxide walls 142C, 142D serving as the second mask patterns on both sides of polysilicon film 130B. Subsequently, two times of implantation of boron ions (in each dose amount of $1 \times 10^{15}$ to $1 \times 10^{16}$ cm$^{-2}$ each) were carried out in symmetrically different directions at oblique implantation angles of 20 to 45 degrees relative to the normal perpendicular to the main surface of the semiconductor structure. Hereby the P-type semiconductor regions 160A, 160B and silicon amorphous regions 170A, 170B were formed with their edge portions extended into areas right under the ends of the silicon oxide films 142A, 142B for PMOS respectively, and simultaneously a P-type semiconductor regions 160C, 160D and silicon amorphous regions 170C, 170D were formed with their edge portions extended into areas right under the ends of the silicon oxide films 142C, 142D for PNP transistor respectively. That is, as shown in FIGS. 17(a) and 17(b), as the result of the ion implantation step at a large implantation angle, each of the amorphous regions is so formed as to have a substantially inverse trapezoidal vertical cross section each end of which is located beneath an edge of the mask member, which stands in striking contrast with the reverse tapered (sharp-angled) configuration in the case where the conventional way of implantation is employed, in which the direction of implantation is substantially vertical relative to the main surface of the semiconductor structure.

Figure 16:
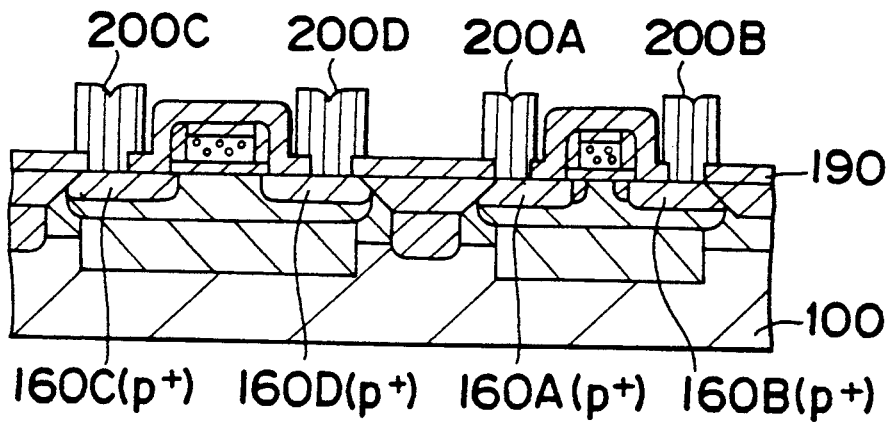
FIG. 16 is a sectional view depicting a third step of fabrication in the fourth example of the invention.

As shown in FIG. 16, a silicon oxide film 190 of about 300 nanometers in thickness was deposited all over the semiconductor structure, and then heat treatment was carried out at temperatures of 900° to 950° C. for 30 minutes. As a result of the heat treatment, the amorphous semiconductor regions 170A, 170B, 170C and 170D were transformed into P-type monocrystal semiconductor regions through solid-phase epitaxial regrowth. The transformed semiconductor regions 170A and 170B were respectively integrally combined with the P-type semiconductor regions 160A and 160B serving as source and drain, and simultaneously the other transformed semiconductor regions 170C and 170D were respectively integrally combined with the P-type monocrystal semiconductor regions 160C and 160D serving as emitter and collector of PNP transistor. Further, aluminum electrodes 200A, 200B, 200C, 200D and 200E were formed according to the conventional method of fabrication.

In this example, according to the method of the present invention, by recrystallization through heat treatment of the amorphous region which was previously formed by oblique directed ion implantation, it becomes possible to inhibit the occurrence of defects known as "voids" (corner defects) which have occurred in edge portions of amorphous regions in the conventional method of fabrication. The method of the invention, when applied to the emitter of a lateral-type PNP transistor, proved to be effective in improving the current amplification factor of the emitter. It also proved to be effective in reducing the electric leakage in the collector when reverse biased.

Moreover, according to the method of the present invention, it becomes possible to prevent the growth of any defect attributable to such comparatively large stress as is encountered in the stage of heat treatment in the manufacturing procedure. The method provides for fabrication in a good yield rate of a horizontal type bipolar PNP transistor incorporated with a P-type channel MOD together having good electrical characteristics using their processes in a common, reducing the number of stages.

The method of the invention provides for additional improvements, which will be described below.

The method of the invention is also applicable to the case where an N-type semiconductor region serving as an emitter of a vertical NPN transistor is formed using the ion implantation technique of the invention. A masking pattern or an insulating layer such as silicon oxide layer having a rectangular opening, which is formed on a P-type semiconductor region serving as a base, is used as a mask, and arsenic ions are implanted through the opening in four rotating oblique directions thereby to form an emitter. According to this method of implantation, it is possible to avoid the occurrence of corner defects at an emitter edge portion located right under the end of the masking pattern.

The method of the invention is also applicable to BiCMOS. An N-type semiconductor region which is to serve as emitter of a vertical NPN transistor and a high-density N-type semiconductor region which is to serve as a portion of source/drain of NMOS are simultaneously formed by obliquely oriented ion implantation in which so-called side walls left on both sides of a polysilicon electrode for gate are used as masks. This provides for simplification of the process, which means a good advantage from the standpoint of production.

An electrically conductive, thin semiconductor film, such as polysilicon film, is formed prior to the stage of obliquely oriented ion implantation. Then, an obliquely oriented ion implantation is performed through the electrically conductive semiconductor film to form a high-density N-type semiconductor region which is to serve as a portion of the source/drain of NMOS. This provides various good advantages as already mentioned. Especially when an N-type semiconductor region which will serve as emitter of a vertical NPN transistor is to be formed by ion implantation, it is possible to effectively avoid the occurrence of crystal defect at the emitter edge portion, by obliquely implanting ions through the thin semiconductor film such as amorphous silicon thin film thereby to form the emitter.

In order to obtain good solid-phase epitaxial growth, impurities such as boron ions are implanted into a substrate kept at a low temperature (e.g. liquid nitrogen temperature) below room temperature, and thereafter the substrate is heated up from room temperature and to as much high temperature as practicable (i.e., 500° C. or more), to allow gradual solid-phase growth. By this procedure, it is possible to form a semiconductor region avoiding a crystalline defect.

In the method of the present invention, in order to transform the semiconductor substrate into amorphous state, impurities such as boron or arsenic ions are obliquely implanted into the substrate. However, before or after the ion implantation, ions of elements which do not determine the electric conduction type such as silicon, argon, or nitrogen may be implanted to accelerate the process of the substrate to be modified into amorphous state. This provides for further satisfactory solid phase growth for recrystallization.

As described above, according to the invention, a mask pattern covering the monocrystal semiconductor region in which principal elements, such as bipolar element and MOS element, are to be formed, is used as a mask, and an ion implantation carrying ions of high concentration is carried out at a considerably inclined implantation angle of more than 20 degrees to form an amorphous region extending into an area located right under the material of the mask. Thereafter, the amorphous region is subjected to heat treatment so as to be transformed into monocrystal state by recrystallization. In this way, the occurrence of the so-called void (corner defect) at the edge portion of the amorphous region involved in the conventional method, can be effectively avoided. Accordingly, it is also possible to prevent the growth of defects due to such comparatively large stress as is encountered in the stage of heat treatment, and thus to produce a bipolar transistor and/or MOS transistor with good yield suppressing the electric leakage.

Although the present invention has been fully described by way of example with reference to the accompanying drawings, it is to be noted here that various changes and modifications will be apparent to those skilled in the art. Therefore, unless otherwise such changes and modifications depart from the scope of the present invention as defined by the appended claims, they should be construed as included therein.

What is claimed is:

1. A method for fabrication of a semiconductor device utilizing ion implantation, comprising the steps of:
   forming a mask pattern covering a monocrystal semiconductor region in which an emitter of a vertical bipolar element is formed;
   implanting ions of high concentration into said semiconductor region for providing an external base, using said mask pattern as a mask, wherein said ion implantation is carried out at a considerably inclined implantation angle of at least 20 degrees when measured from a vertical direction relative to the surface of the substrate to form in said semiconductor region an amorphous region a) having a substantially inverse trapezoidal vertical cross section and b) having an end which extends into an area just below an edge of said mask; and recrystallizing said amorphous region by heat treatment.

2. A method for fabrication of a semiconductor device utilizing ion implantation, comprising the steps of:

forming a mask pattern covering a monocrystal semiconductor region;

implanting ions of high concentration into said semiconductor region, using said mask pattern as a mask, wherein said ion implantation is carried out at a considerably inclined implantation angle of at least 20 degrees when measured from a vertical direction relative to the surface of the substrate to form in said semiconductor region am amorphous region a) having a substantially inverse trapezoidal vertical cross section and b) having an end which extends into an area just below an edge of said mask;

forming an alloy of metal and semiconductor on the exposed surface portion of said semiconductor region which is not covered with said mask pattern; and recrystallizing said amorphous region by heat treatment, thereby to inhibit the metal atoms for forming said alloy from being anomalously diffused within said semiconductor region which contains the impurities of high concentration.

3. A method for fabrication of a semiconductor device utilizing ion implantation, comprising the steps of:

leaving a first mask pattern at both sides of a gate electrode portion of a field effect transistor;

leaving a second mask pattern covering a monocrystal semiconductor region for providing an emitter of a vertical bipolar transistor;

implanting ions of high concentration simultaneously into said semiconductor regions for providing a source, drain and external base, using said first and second mask patterns as the masks respectively, wherein said ion implantation is carried out at a considerably inclined implantation angle of at least 20 degrees when measured from a vertical direction relative to the surface of the substrate, thereby to form amorphous regions in said semiconductor region so as to have substantially inverse trapezoidal vertical cross sections of said amorphous region, each end of which is extending sufficiently into an area just below said first and second mask edges; and recrystallizing said amorphous regions by heat treatment.

4. A method for fabrication of a semiconductor device utilizing ion implantation, comprising the steps of:

leaving a first mask pattern at both sides of a gate electrode portion of a field effect transistor;

leaving a second mask pattern covering a monocrystal semiconductor region for providing an emitter of a vertical bipolar transistor;

implanting ions of high concentration simultaneously into said semiconductor regions for providing a source, drain and external base, using said first and second mask patterns as the masks respectively, wherein said ion implantation is carried out at a considerably inclined implantation angle of at least 20 degrees when measured from a vertical direction relative to the surface of the substrate, thereby to form amorphous regions in said semiconductor region so as to have substantially inverse trapezoidal vertical cross sections of said amorphous regions, each end of which is extending sufficiently into an area just below said first and second mask edges;

forming an alloy of metal and semiconductor on the exposed surface portion of said semiconductor region which is not covered with said mask patterns; and recrystallizing said amorphous regions by heat treatment, thereby to inhibit the metal atoms for forming said alloy from being anomalously diffused within said semiconductor regions which contain the impurities of high concentration.

5. A method for fabrication of a semiconductor device utilizing ion implantation, comprising the steps of:

forming a mask pattern on a monocrystal semiconductor region for determining the width of a base of a lateral bipolar element;

implanting ions of high concentration into said semiconductor region for providing at least an emitter, using said mask pattern as a mask, wherein said ion implantation is carried out at a considerably inclined implantation angle of at least 20 degrees when measured from a vertical direction relative to the surface of the substrate to form in said semiconductor region an amorphous region a) having a substantially inverse trapezoidal vertical cross section and b) having an end which extends into an area just below an edge of said mask; and recrystallizing said amorphous region by heat treatment.

6. A method for fabrication of a semiconductor device utilizing ion implantation as set forth in any one of claims 1 to 5, wherein before or after said ion implantation of high concentration for forming said semiconductor regions, an additional ion implantation of high concentration for forming the amorphous region is carried out using a kind of ions which do not determine the electric conduction type of said semiconductor regions.

7. A method for fabrication of a semiconductor device utilizing ion implantation as set forth in any one of claims 1 to 5, wherein in the recrystallizing step by heat treatment, after ions are implanted into the semiconductor substrate which is kept at a temperature lower than room temperature to help formation of an amorphous region, the substrate is heated up from room temperature to as much high temperature as practicable so as to gradually allow solid-phase epitaxial growth of monocrystal region in the amorphous region, whereby a semiconductor region may be formed which is less liable to crystal defect.

* * * * *